United States Patent [19]
Pierce et al.

[11] Patent Number: 5,361,034
[45] Date of Patent: Nov. 1, 1994

[54] APPARATUS FOR MEASURING THE CONDUCTIVITY OF A FLUID

[75] Inventors: Brian M. Pierce, Moreno Valley; David B. Chang, Tustin; Kenn S. Bates, Long Beach, all of Calif.

[73] Assignee: Hughes Aircraft Company, Los Angeles, Calif.

[21] Appl. No.: 732,512

[22] Filed: Jul. 18, 1991

Related U.S. Application Data

[62] Division of Ser. No. 447,333, Dec. 7, 1989, Pat. No. 5,072,188.

[51] Int. Cl.$^5$ ............... G01R 29/12; G01N 27/60
[52] U.S. Cl. .................... 324/663; 324/453; 361/227
[58] Field of Search ............ 324/663, 671, 686, 690, 324/453, 454, 452; 361/225, 227, 228

[56] References Cited

U.S. PATENT DOCUMENTS

| | | | |
|---|---|---|---|
| 3,260,616 | 7/1966 | Brewer | 324/453 X |
| 3,753,102 | 8/1973 | Beck | 324/453 |
| 4,117,715 | 10/1978 | Hoenig | 324/452 X |
| 4,321,546 | 3/1982 | Schneider, Jr. | 324/452 X |
| 4,433,296 | 2/1984 | Kolibas | 324/452 |
| 4,986,471 | 1/1991 | Hethcoat | 324/457 |
| 5,068,617 | 11/1991 | Reich | 324/663 |
| 5,093,625 | 3/1992 | Lunzer | 324/457 |
| 5,117,190 | 5/1992 | Pourprix | 324/457 |

*Primary Examiner*—Maura K. Regan
*Attorney, Agent, or Firm*—Georgann S. Grunebach; Terje Gudmestad; W. K. Denson-Low

[57] ABSTRACT

An apparatus for measuring the conductivity of a fluid is disclosed. The invention 10 provides both a contact and non-contact monitoring of fluid conductivity by measuring the A.C. dielectric properties of the fluid. The invention 10 transmits an electromagnetic wave into the fluid 22 and analyzes the transmitted and reflected waves providing an indication of the conductivity of the fluid 22. The invention 10 is versatile in that it allows for the fluid to be in the form of a spray. In a specific illustrative implementation, a novel nozzle is provided to monitor the conductivity of paint spray 22 as it passes therethrough.

4 Claims, 2 Drawing Sheets

APPARATUS FOR MEASURING THE CONDUCTIVITY OF A FLUID

This is a division of application Ser. No. 07/447,333, filed Dec. 7, 1989, now U.S. Pat. No. 5,072,188.

BACKGROUND OF THE INVENTION

1. Field of the Invention

The present invention relates to paint spraying. More specifically, the present invention relates to techniques for monitoring paint conductivity in electrostatic spraying.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Electrostatic spraying is a currently well accepted technique for painting motor vehicles. Electrostatic spraying involves charging a paint bath with one polarity and a target surface with the second polarity. The liquid is then sprayed toward the surface. Paint droplets are electrostatically attracted and bonded to the surfaces of the charged vehicle.

The efficacy of conventional electrostatic spraying systems depends largely on the accurate monitoring of the viscosity of the paint. If the viscosity is too large, the paint coating exhibits lumpiness, a condition commonly referred to as =orange peel☐. The conductivity of the paint is a measure of the paint viscosity. Higher conductivity indicates lower viscosity. In addition, the conductivity is related to how well droplets form in the spray nozzle. High conductivity permits better control of droplet size.

Current techniques use electrical equipment to measure the DC (direct current) resistivity of the paint in the bath. This is accomplished by direct contact between electrodes and the paint bath. While this technique may be somewhat effective in measuring the conductivity of the paint in the bath, it is not generally capable of measuring the conductivity of the paint in a spray.

This shortcoming is significant as the electrical properties of the paint have been observed to change with a state change from liquid to spray. Hence, there is a need in the art for a measurement apparatus and technique effective in measuring the electrical properties of paint in a spray form.

SUMMARY OF THE INVENTION

The present invention addresses the need in the art by providing a novel approach to both contact and noncontact monitoring of paint conductivity. The novel approach of the present invention involves the measurement of the A.C. dielectric properties of the fluid. The apparatus of the present invention transmits an electromagnetic wave into the fluid and analyzes the transmitted and reflected waves to provide an indication of the conductivity of the fluid. The invention is versatile in that it allows for the conductivity measurements while the fluid is in the form of a spray.

In a specific illustrative implementation, the conductivity of the fluid is measured before it is sprayed by passing the fluid through a fluid sampling cell. The conductivity of the fluid flowing through the fluid sampling cell is then measured with an impedance measuring unit.

DESCRIPTION OF THE INVENTION

Illustrative embodiments and exemplary applications will now be described with reference to the accompanying drawings to disclose the advantageous teachings of the present invention.

Figure 1:
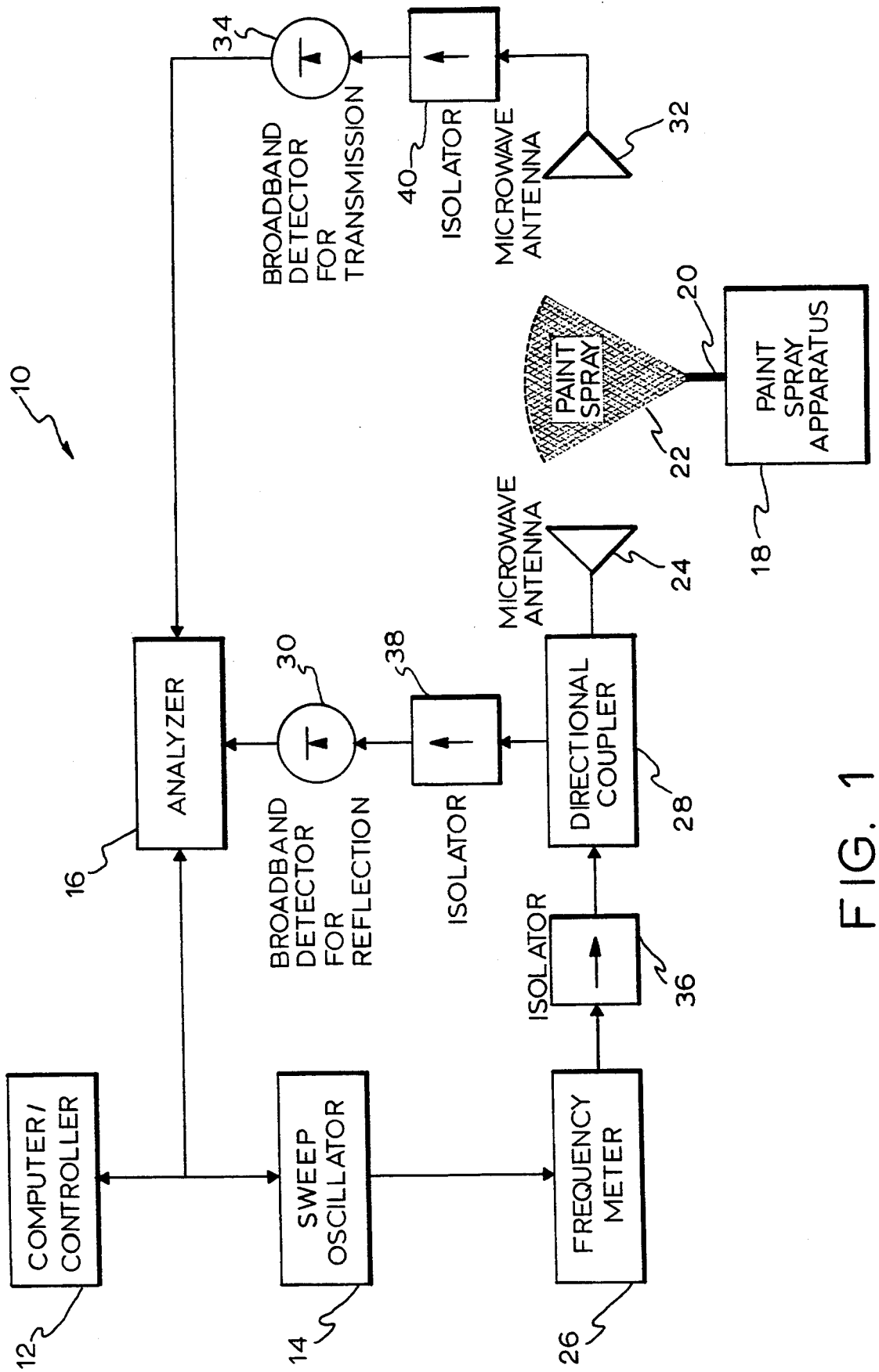
FIG. 1 shows a block diagram of an illustrative implementation of an apparatus for measuring the conductivity of a paint in a spray constructed in accordance with the teachings of the present invention.

FIG. 1 shows a block diagram of an illustrative implementation of an apparatus 10 for measuring the conductivity of a paint in a spray constructed in accordance with the teachings of the present invention. The apparatus 10 is shown in operative relationship to a conventional paint spraying apparatus 18. The paint spray apparatus 18 includes a nozzle 20 which provides a volume of paint spray 22. The apparatus 10 includes a computer/controller 12 which controls a sweep oscillator 14 and a network analyzer 16. The computer/controller 12 and all other elements used in the invention may be of conventional design. The sweep oscillator 14 generates an electromagnetic wave over a frequency range which is transmitted normal to the volume of paint spray 22 by a microwave antenna 24. A frequency meter 26, connected to the sweep oscillator 14, is set at a frequency within the frequency range of the electromagnetic wave. Radiation at the set frequency is rejected and serves as a useful frequency marker. A directional coupler 28 couples the frequency meter 26 and the microwave antenna 24, while also coupling a broadband detector 30 and the microwave antenna 24. The broadband detector 30 detects reflections from the volume of paint spray 22 received by the microwave antenna 24. The network analyzer 16 is connected to the broadband detector 30 and analyzes the reflected energy. A second microwave antenna 32, opposite the first microwave antenna 24, receives the transmitted wave which is then detected by a second broadband detector 34. The second broadband detector 34 is also connected to the network analyzer 16, which analyzes energy in the transmitted wave. The computer/controller 12 connected to the network analyzer 16 processes data therefrom and provides an indication of the conductivity of the paint. An isolator 36, situated between the frequency meter 26 and the directional coupler 28, provides isolation of the incident wave from the reflected wave. A second isolator 38, between the directional coupler 28 and the first broadband detector 30, provides isolation of the reflected wave. A third isolator 40, between the second broadband detector 34 and the second microwave antenna 32, provides isolation of the transmitted wave.

Figure 2:
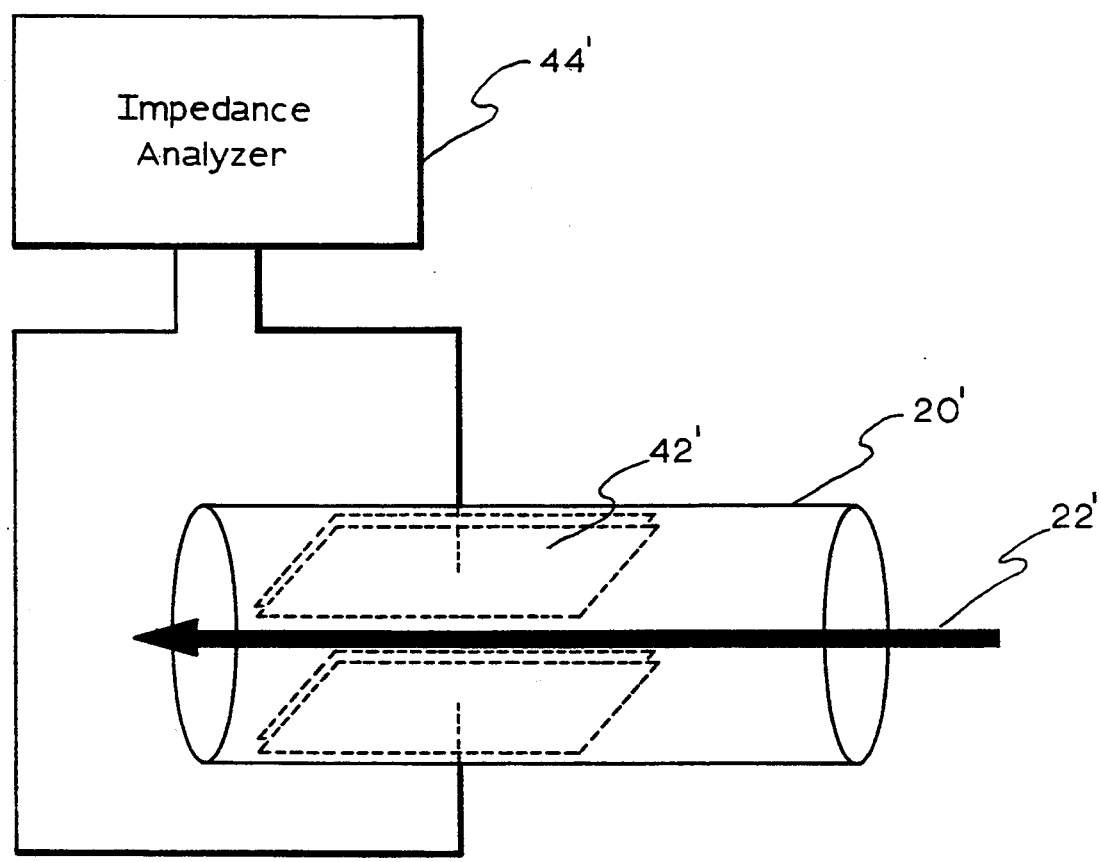
FIG. 2 shows a block diagram of an illustrative implementation of a contact approach to measuring fluid conductivity which may be utilized in the apparatus of the present invention.

FIG. 2 shows a novel implementation of the nozzle 20 of the paint spraying apparatus 18. In this embodiment, the nozzle 20' includes a capacitor 42'. As paint is sprayed, the spray flows between the plates of the capacitor 42' and the impedance of the capacitor 42' can be measured by an impedance analyzer 44'. Hence, the conductivity of the paint can be calculated in the manner set forth below.

The complex conductivity $\sigma$ and the complex dielectric constant $\epsilon$ of the paint can be defined in terms of real and imaginary components:

$$94 = \sigma' + i\sigma'' \qquad [1]$$

and $$\epsilon = \epsilon' + i\sigma'' \qquad [2]$$

The complex conductivity can be defined in terms of the complex dielectric constant by equation [3] below:

$$\sigma = -i\omega\epsilon \qquad [3]$$

where $\omega$ is the angular radiation frequency. The real and imaginary parts of complex conductivity $\sigma$ and the complex dielectric constant $\epsilon$ can therefore be equated:

$$\sigma' = \nu\epsilon''/1.8 \times 10^{12} \qquad [4]$$

and $$\sigma'' = \nu\epsilon'/1.8 \times 10^{12} \qquad [5]$$

where the units for $\sigma'$ and $\sigma''$ are $1/\Omega$-cm, $\epsilon'$ and $\epsilon''$ are dimensionless in cgs units, and $\nu$ is the radiation frequency in hertz (Hz).

The non-contact approach involving the nozzle design of the present invention is based on equations relating the conductance of the fluid to the transmittance, reflectance, and absorbance of the electromagnetic wave incident normal to the fluid.

The transmittance $T(\omega)$ of a material can be expressed in terms of reflectance $R(\omega)$ and absorbance $A(\omega)$:

$$T(\omega) = 1 - R(\omega) - A(\omega) - S(\omega) \qquad [6]$$

where $S(\omega)$ represents scattering, and does not play a significant role in the equations. The reflectance at the air-material interface for an electromagnetic plane wave incident normal to the material is generally given by:

$$R(\omega) = [(\eta'(\omega) - 1)^2 + \eta''(\omega)^2]/[(\eta'(\omega) + 1)^2 \eta''(\omega)^2] \qquad [7]$$

and the absorbance is:

$$A(\omega) = 1 - \exp[-2\eta''(\omega)d\omega/c] \qquad [8]$$

where $\eta'$ and $\eta''$ are the real and imaginary components of the complex refractive index for the material, d is the thickness, and c is the speed of light.

The complex index of refraction ($\eta = \eta' + i\eta''$) is related to the complex dielectric constant by ($\eta = \epsilon^{\frac{1}{2}}$). The real and imaginary parts of $\eta$ can then be expressed in terms of $\epsilon'$ and $\epsilon''$:

$$\eta'^2 = [\epsilon' + (\epsilon'^2 + \epsilon''^2)^{\frac{1}{2}}]/2 \qquad [9]$$

and $$\eta''^2 = [-\epsilon' + (\epsilon'^2 + \epsilon''^2)^{\frac{1}{2}}]/2 \qquad [10]$$

Replacing $\epsilon'$ and $\epsilon''$ by $\sigma'$ and $\sigma''$ given in equations [4] and [5], then yields:

$$\eta'^2 = (\nu/1.8 \times 10^{12})[-\sigma'' + (\sigma''^2 + \sigma'^2)^{\frac{1}{2}}]/2 \qquad [11]$$

and $$\eta''^2 = (\nu/1.8 \times 10^{12})[\sigma'' + (\sigma''^2 + \sigma'^2)^{\frac{1}{2}}]/2 \qquad [12]$$

Substituting $\eta'$ and $\eta''$ into [7] and [8], the reflectance and absorbance, and therefore the transmittance, can be found in terms of the conductance. Further, the transmittance is inversely proportional to the conductance. From this result, the conductivity of a fluid can then be determined by measuring the transmittance of the fluid.

Equations relating the conductivity to the complex impedance of a parallel plate capacitor are given below. Equations relating the conductivity to the complex impedance of other fluid sampling cells of different architecture can be derived in a similar manner.

The voltage (V) for a parallel plate capacitor is given by:

$$V = qd/\kappa_o A\epsilon \qquad [13]$$

where q is the charge on the capacitor, d is the distance between the plates, $\kappa_o$ is the permittivity of free space, and A is the area of the plates. The terms V, q, and $\epsilon$ are complex in general. In the case of a time-varying periodic voltage $V = V_o e^{-i\omega t}$, and a resultant time-varying charge q(t), $$V(t) = V_o e^{-i\omega t} = q(t)d/\kappa_o A\epsilon \qquad [14]$$

Differentiating both sides of equation [14] with respect to time gives:

$$\dot{V}(t) = \dot{q}(t)d/\kappa_o A(-i\omega\epsilon) \qquad [15]$$

The complex impedance, Z, is defined by V/Z = j, and so insertion of this relation into equation [15] yields an expression for Z:

$$Z = (d/\kappa_o A)(1/-i\omega\epsilon) \qquad [16]$$

Since the empty cell capacitance, $C_o$, is equal to $\kappa_o A/d$ and $\sigma = -i\omega\epsilon$, Equation [16] becomes $$Z = 1/C_o\sigma \qquad [17]$$

As the complex impedance is inversely proportional to the complex conductivity, the conductivity of the fluid flowing through the sampling cell can be determined.

Thus, the present invention has been described herein with reference to a particular embodiment for a particular application. Those having ordinary skill in the art and access to the present teachings will recognize additional modifications applications and embodiments within the scope thereof. For example, the invention is not limited to the technique by which the electromagnetic wave is generated or measured. Functionally equivalent test equipment and test set-ups may be substituted for those used in FIG. 1 and FIG. 2. Nor is the invention limited to measuring the conductivity of paint.

Further, the invention is not limited to the use of a parallel plate capacitor as a fluid sampling cell. It will be appreciated by those skilled in the art, that the parallel plate capacitor 42' in FIG. 2 may be replaced by a cell of different architecture. Those skilled in the art will appreciate that this scheme would require that the relationship between the conductivity and the impedance of the cell be derived in a similar manner as that disclosed herein.

It is therefore intended by the appended claims to cover any and all such applications, modifications and embodiments within the scope of the present invention.

Accordingly,

What is claimed is:

1. An apparatus for measuring alternating current dielectric properties of a charged fluid comprising:

a nozzle for spraying said charged fluid;

a capacitor disposed in said nozzle and a having first and second capacitive plates wherein an alternating current voltage signal is applied to said capacitor; and analyzer means coupled to said first and second plates for measuring a characteristic of said capacitor when said charged fluid is sprayed through said nozzle to thereby indicate said alternating current dielectric properties of said charged fluid.

2. The invention of claim 1 wherein said analyzer means includes an impedance analyzer for measuring the impedance of said capacitor when said alternating current voltage signal is applied to said capacitor.

3. The invention of claim 1 herein said fluid is a paint.

4. The invention of claim 1 wherein said analyzer means includes means for determining the complex impedance of said capacitor to indicate conductivity of said charged fluid.

* * * * *